(12) United States Patent
Tokunaga

(10) Patent No.: US 7,595,998 B2
(45) Date of Patent: Sep. 29, 2009

(54) ELECTRONIC CIRCUIT DEVICE

(75) Inventor: Shigetomi Tokunaga, Kanagawa (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/568,293

(22) PCT Filed: Nov. 8, 2005

(86) PCT No.: PCT/JP2005/020774

§ 371 (c)(1),
(2), (4) Date: Oct. 25, 2006

(87) PCT Pub. No.: WO2006/051927

PCT Pub. Date: May 18, 2006

(65) Prior Publication Data

US 2007/0222046 A1    Sep. 27, 2007

(30) Foreign Application Priority Data

Nov. 10, 2004  (JP) .............................. 2004-326216

(51) Int. Cl.
*H05K 5/00* (2006.01)
(52) U.S. Cl. ...................................... 361/752; 361/807
(58) Field of Classification Search ................ 361/760, 361/741, 730, 720, 736, 748, 752, 790, 797, 361/800, 807, 810, 803; 174/260–261
See application file for complete search history.

(56) References Cited

U.S. PATENT DOCUMENTS

| | | | | |
|---|---|---|---|---|
| 4,884,125 A * | 11/1989 | Miura | ........................ | 174/253 |
| 5,803,604 A * | 9/1998 | Pompei | ...................... | 374/181 |
| 5,838,578 A * | 11/1998 | Pippin | ........................... | 716/4 |
| 5,870,267 A * | 2/1999 | Kitano | ........................ | 361/103 |
| 6,107,669 A | 8/2000 | Mokuya et al. | | |
| 6,117,797 A * | 9/2000 | Hembree | ..................... | 438/759 |
| 6,201,696 B1 * | 3/2001 | Shimizu et al. | ............. | 361/704 |
| 6,308,121 B1 * | 10/2001 | Ulm | ............................ | 701/35 |
| 6,493,228 B1 * | 12/2002 | Suzuki et al. | ................ | 361/704 |
| 6,646,884 B1 | 11/2003 | Frisch et al. | | |
| 6,695,483 B2 * | 2/2004 | Sakatani et al. | ............. | 384/448 |
| 6,852,399 B2 * | 2/2005 | Takahashi et al. | ........... | 428/213 |
| 6,998,089 B2 * | 2/2006 | Osaki | ......................... | 264/401 |
| 7,187,060 B2 * | 3/2007 | Usui | .......................... | 257/659 |
| 7,301,228 B2 * | 11/2007 | Usui et al. | .................. | 257/698 |
| 2003/0107876 A1 | 6/2003 | Suzuki | | |

FOREIGN PATENT DOCUMENTS

| | | |
|---|---|---|
| JP | 10048057 | 2/1998 |
| WO | WO96/27942 A | 9/1996 |
| WO | WO02/49194 A | 6/2002 |

OTHER PUBLICATIONS

International Search Report for corresponding International Application No. PCT/JP2005/020774 dated Jul. 19, 2006.

* cited by examiner

*Primary Examiner*—Hung S Bui
(74) *Attorney, Agent, or Firm*—RatnerPrestia

(57) ABSTRACT

An electronic circuit device includes a sub-board disposed upright on a main board. The sub-board is electrically coupled to the main board via a board terminal) disposed at sub-board edge. A semiconductor element is mounted on the sub-board facing the sub-board in parallel. A temperature sensor is also mounted on the sub-board. A heat sink is formed so as to surround the sub-board and the semiconductor element. A resin material is injected inside a heat sink so as to cover the sub-board, the temperature sensor, and the semiconductor element.

5 Claims, 4 Drawing Sheets

FIG. 6 PRIOR ART

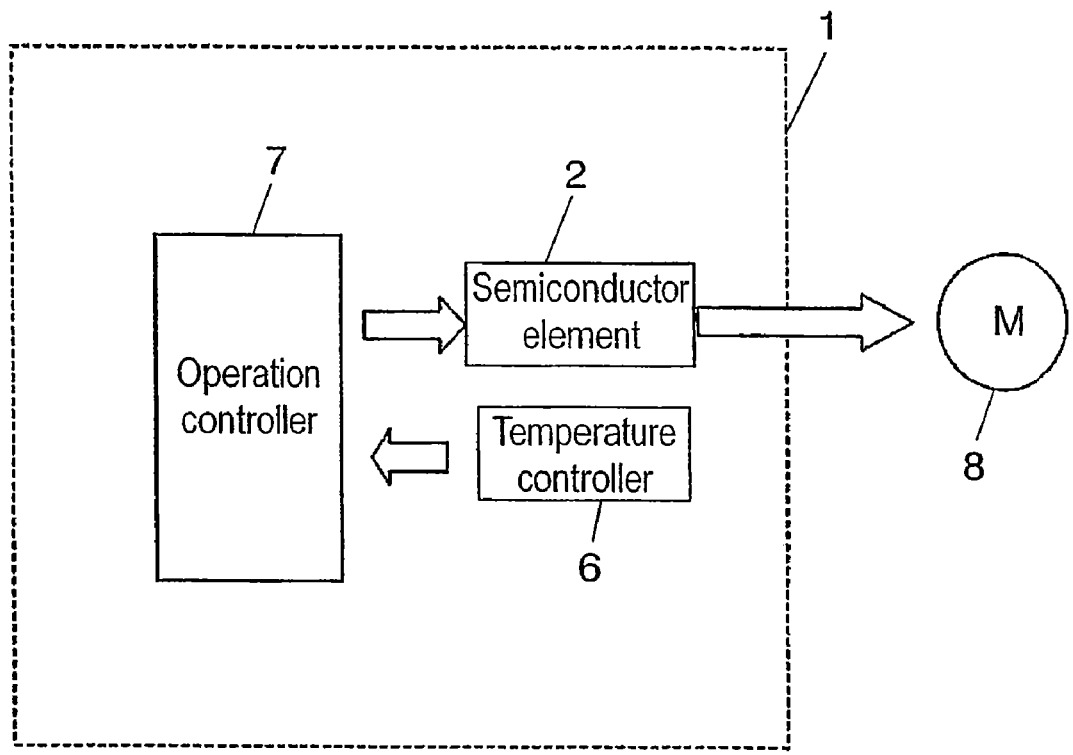
FIG. 7 PRIOR ART

ELECTRONIC CIRCUIT DEVICE

This application is a U.S. National Phase Application of PCT International Application PCT/JP2005/020774 dated Nov. 8, 2005.

TECHNICAL FIELD

The present invention relates to electronic circuit devices in which a semiconductor element such as an IPM (Intelligent Power Module), used typically for inverter control apparatuses, is mounted on a circuit board and the temperature of this semiconductor element is detected for protection.

BACKGROUND ART

Numerous apparatuses employing inverter control, such as refrigerators, have been released onto the market. An IPM semiconductor element is generally employed in the electronic circuit devices of these inverter apparatuses. Comprising a single module, the IPM semiconductor element incorporates an inverter-driving circuit for motors and a protective circuit against over current in the driving circuit.

The electronic circuit device in these inverter apparatuses acts to protect and control the driving semiconductor element in such a way that, for example, the carrier frequency is reduced when a rise in the temperature of semiconductor element is detected.

One method of detecting the temperature of semiconductor elements is proposed in Japanese Patent Unexamined Publication No. H10-48057. A temperature sensor is attached using an automated insertion machine, and thus a fitting is not needed. This is a method of providing a temperature sensor attachment area in the form of a printed wiring pattern that extends from the printed wiring pattern for mounting the semiconductor element, and mounting the temperature sensor in such a way that its thermosensitive element is closely attached to the temperature sensor attachment area.

This conventional electronic circuit device is described next with reference to drawings. FIG. 6 is a perspective view of the conventional electronic circuit device described in the aforementioned prior art. FIG. 7 is a block diagram of an electric circuit of the same conventional electronic circuit device.

In FIGS. 6 and 7, electronic circuit device 1 includes semiconductor element 2, printed circuit board 3, heat sink 4, attachment screw 5, temperature sensor 6, and operation controller 7.

Semiconductor element 2 is, for example, an element for driving a motor that generates heat during use because it carries a high current. When the temperature of semiconductor element 2 rises, thermal destruction occurs, and semiconductor element 2 breaks down. To prevent this from happening, semiconductor element 2 is mounted on printed circuit board 3 with heat sink 4 closely attached to semiconductor element 2 using attachment screw 5 so that the heat generated from semiconductor element 2 can be conducted away.

Semiconductor element 2 is mounted and electrically coupled to printed circuit board 3 by inserting semiconductor terminals 2a of semiconductor element 2 into attachment holes 3a created on printed circuit board 3, and soldering semiconductor terminals 2a onto patterns 3b formed around attachment holes 3a.

A relatively broad patterned sensor attachment area 3c extends from, for example, one of patterns 3b at the center, and temperature sensor 6 is mounted on printed circuit board 3 in such a way as to contact this sensor attachment area 3c.

Further, operation controller 7 is mounted on printed circuit board 3. This operation controller 7 provides instructions for operation of semiconductor element 2 and protects semiconductor element 2 by monitoring the temperature detected by temperature sensor 6.

As shown in FIG. 7, motor 8, for example, which is a load driven by semiconductor element 2, is connected to outside electronic circuit device 1.

The operation of the electronic circuit device as configured above is described next.

Semiconductor element 2 operates upon receiving instructions from operation controller 7, on which motor 8 is driven. At that time, semiconductor element 2 generates heat, but the temperature normally does not increase excessively because the generated heat is released by heat sink 4. However, if semiconductor element 2 is operated under high-temperature or abnormal conditions, such as radiation by heat sink 4 being hindered for any reason, the temperature of semiconductor element 2 will rise.

When the temperature of semiconductor element 2 rises, the temperature of its semiconductor terminals 2a also rises, and thus the temperatures of patterns 3b coupled to semiconductor terminals 2a and sensor attachment area 3c also increase over normal levels.

Since temperature sensor 6 is attached to sensor attachment area 3c, a temperature rise in sensor attachment area 3c also increases the temperature of temperature sensor 6. When temperature sensor 6 exceeds a predetermined temperature, operation controller 7 acts to protect semiconductor element 2 such as by stopping the operation of semiconductor element 2, based on a signal from temperature sensor 6.

However, temperature sensor 6 in the above conventional structure does not directly detect the temperature of semiconductor element 2. Therefore, if, for example, the correlation between temperatures of semiconductor element 2 and temperature sensor 6 changes due to ambient temperature or air convection in electronic circuit device 1, the temperature at which semiconductor device 2 is stopped for protection will differ, resulting in an inability to protect semiconductor element 2 by holding it at an appropriate temperature.

SUMMARY OF THE INVENTION

An electronic circuit device of the present invention includes a sub-board electrically coupled to a main board via a board terminal disposed at the sub-board edge, and disposed upright on the main board. A semiconductor element is mounted on the sub-board in such a way that it faces the sub-board in parallel. The temperature sensor is also mounted on the sub-board. A heat sink is molded so as to surround the sub-board and the semiconductor element. A resin material is injected inside the heat sink to cover the sub-board, the temperature sensor, and the semiconductor element.

This structure reduces the temperature difference between the semiconductor element and temperature sensor. Accordingly, the electronic circuit device of the present invention can accurately detect the temperature of the semiconductor element by means of the temperature sensor, and thus it is highly reliable.

BRIEF DESCRIPTION OF THE DRAWINGS

FIG. 6 is a perspective view of a conventional electronic circuit device.

FIG. 7 is a block diagram of an electric circuit of the electronic circuit device shown in FIG. 6.

DETAILED DESCRIPTION OF THE PREFERRED EMBODIMENTS

An electronic circuit device in the preferred embodiment of the present invention is described below.

The electronic circuit device in the preferred embodiment of the present invention includes a sub-board electrically coupled to a main board via a board terminal disposed on the sub-board edge, and disposed upright on the main board; a semiconductor element mounted on the sub-board facing the sub-board in parallel; a temperature sensor mounted on the sub-board; a heat sink molded so as to surround the sub-board and the semiconductor element; and a resin material injected inside the heat sink so as to cover the sub-board, the temperature sensor, and the semiconductor element.

This structure reduces the temperature difference between the semiconductor element and the temperature sensor, thus enabling accurate detection of the temperature of the semiconductor element. Accordingly, the present invention offers a highly reliable electronic circuit device.

The above temperature sensor should ideally be mounted on the sub-board on the same side as the semiconductor element. This minimizes the distance between the temperature sensor and the semiconductor element, and thus further reduces the temperature difference between them. An even more highly reliable electronic circuit device is provided by accurately detecting the temperature of the semiconductor element.

Still more, the use of resin material with high heat conductivity improves the heat conductance among the semiconductor element, the heat sink, and the temperature sensor. This still further reduces the temperature difference between the semiconductor element and the temperature sensor, and enables even more accurate detection of the temperature of the semiconductor element. Accordingly, the present invention offers an even more reliable electronic circuit device.

Details of the preferred embodiment of the present invention are described next with reference to drawings. It is apparent, however, that the present invention is not limited to the preferred embodiment.

Figure 1:
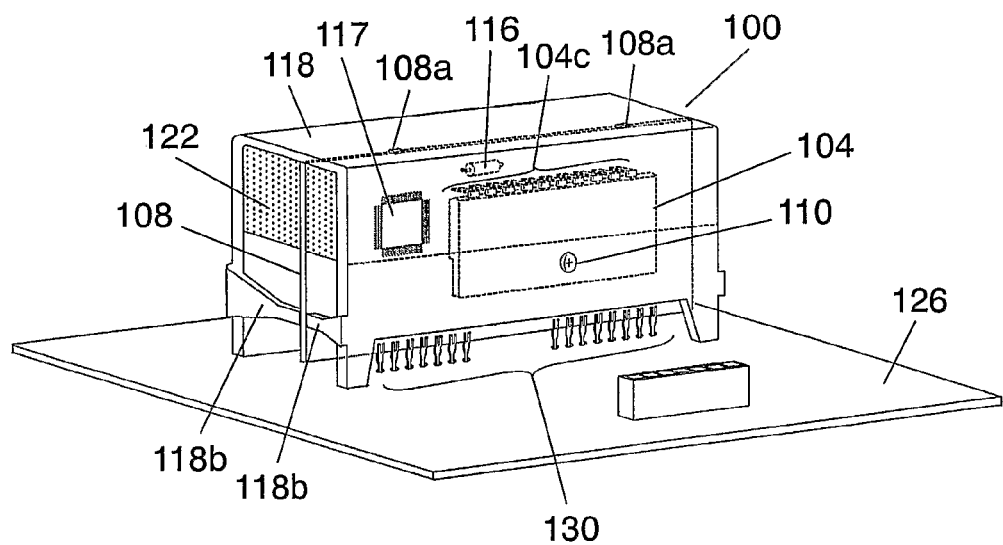
FIG. 1 is a perspective view of an electronic circuit device in accordance with a preferred embodiment of the present invention.
Figure 2:
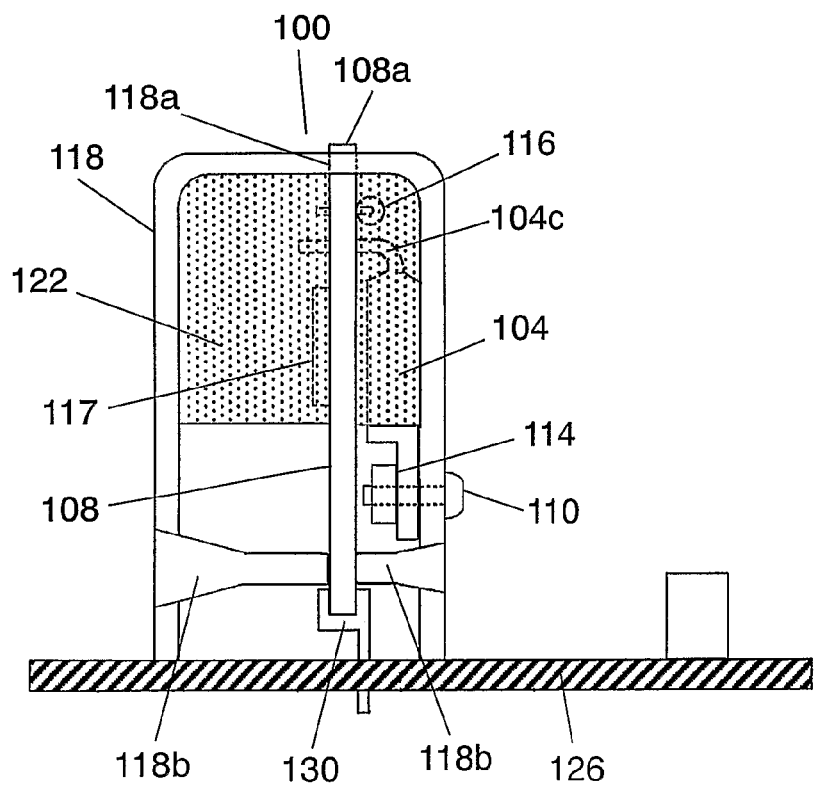
FIG. 2 is a sectional side view of the electronic circuit device shown in FIG. 1.
Figure 3:
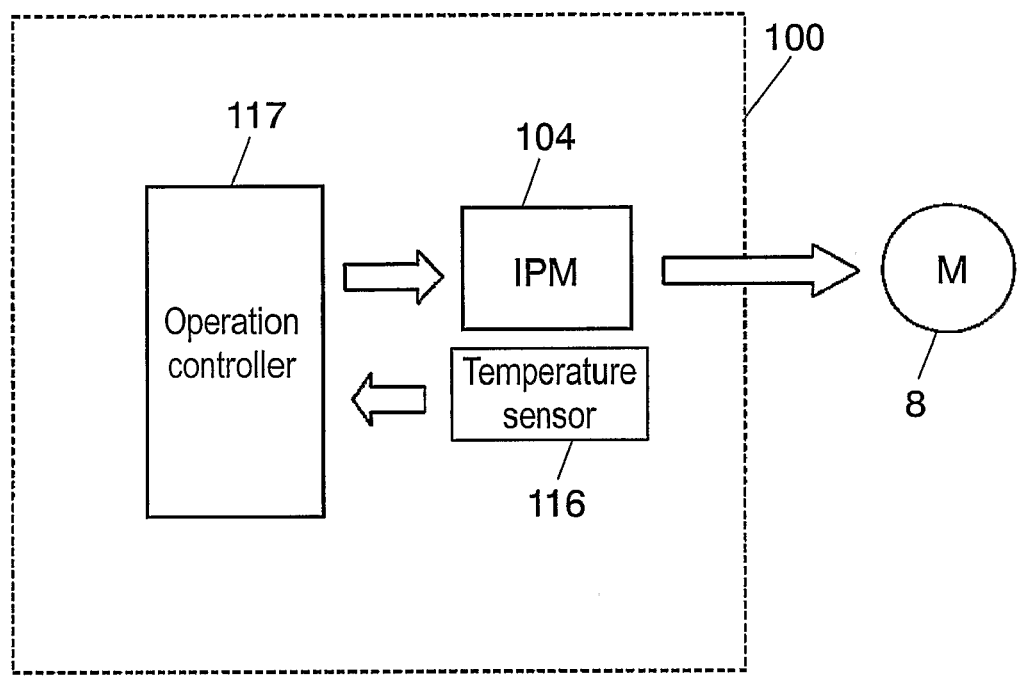
FIG. 3 is a block diagram of an electric circuit of the electronic circuit device shown in FIG. 1.
Figure 4:
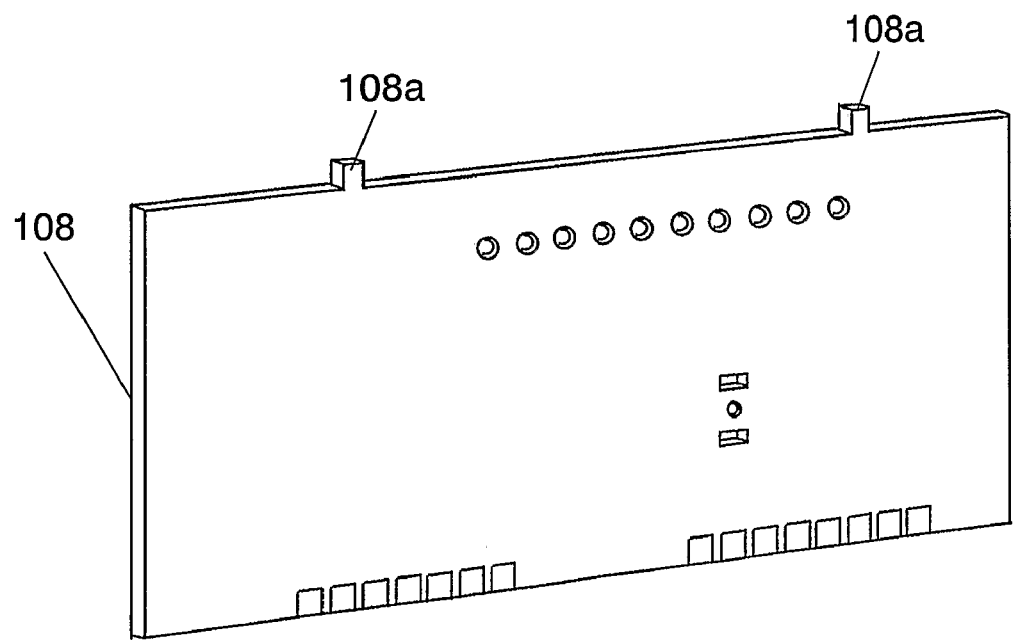
FIG. 4 is a perspective view of a sub-board of the electronic circuit device shown in FIG. 1.
Figure 5:
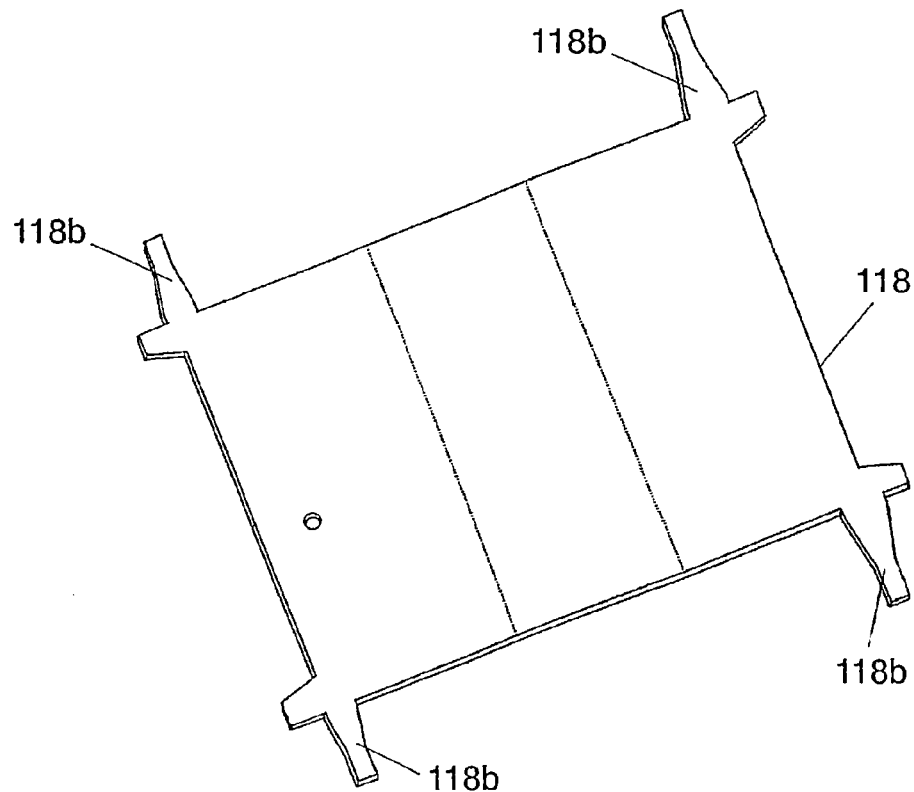
FIG. 5 is a perspective view before bending a heat sink in the electronic circuit device shown in FIG. 1.
Figure 5:
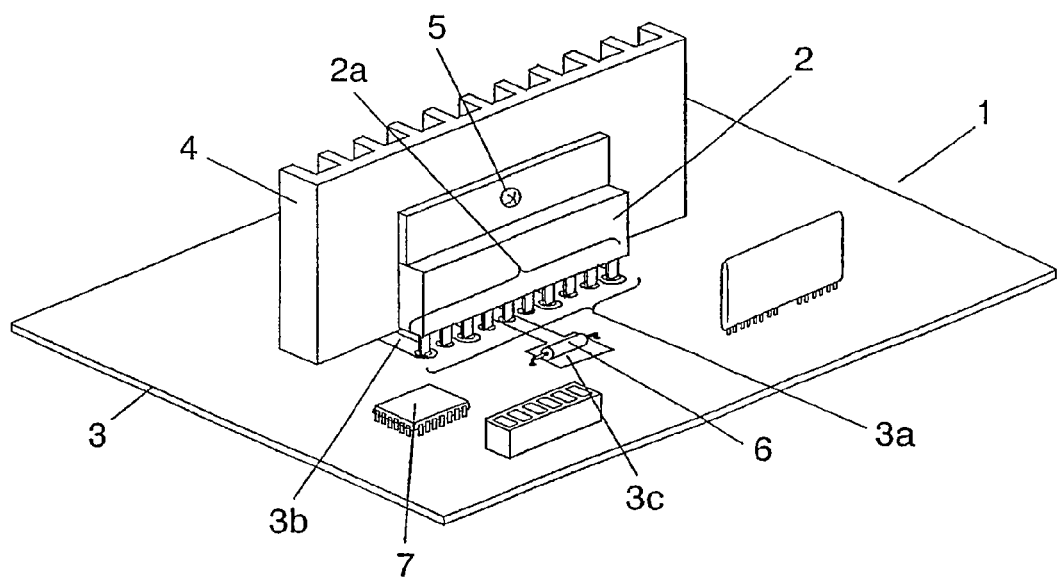

FIG. 1 is a perspective view of an electronic circuit device in the preferred embodiment of the present invention. FIG. 2 is a sectional side view of the electronic circuit device shown in FIG. 1. FIG. 3 is a block diagram of an electric circuit of the electronic circuit device shown in FIG. 1. FIG. 4 is a perspective view of the sub-board of the electronic circuit device shown in FIG. 1. FIG. 5 is a perspective view before bending the heat sink in the electronic circuit device shown in FIG. 1.

In FIGS. 1 and 2, electronic circuit device 100 is electrically coupled to main board 126 via board terminal 130 disposed on the edge, and includes sub-board 108 disposed upright on main board 126. Semiconductor element 104 is mounted on sub-board 108 facing sub-board 108 in parallel. Temperature sensor 116 is also mounted on sub-board 108. Heat sink 118 is molded so as to surround sub-board 108 and semiconductor element 104. Resin material 122 is injected inside heat sink 118 so as to cover sub-board 108, temperature sensor 116, and semiconductor element 104.

In the description, semiconductor element 104 is, for example, IPM of SIP (single inline package) type. Resin material 122 is, for example, a potting material which covers a target by pot molding.

Operation controller 117 is also mounted on sub-board 108. Semiconductor device 104 is fixed to heat sink 118 by attachment screw 110 and nut 114. Electronic circuit device 100 is configured including these components described above.

Next, detailed configuration of electronic circuit device 100 is described.

Semiconductor element 104 has multiple element terminals 104c. Sub-board 108 and semiconductor element 104 face each other in parallel, and semiconductor element 104 is mounted by soldering element terminals 104c onto sub-board 108.

Semiconductor element 104 is closely attached to an inner wall of heat sink 118, formed by bending a metal sheet to U-shape, using attachment screw 110 and nut 114.

Temperature sensor 116 is mounted on sub-board 108 on the same mounting face as semiconductor element 104. On the other mounting face, operation controller 117 is mounted. This operation controller 117 gives operation commands to semiconductor element 104 and protect semiconductor element 104 depending on the temperature of temperature sensor 116.

Heat sink 118 is formed so as to surround sub-board 108 and semiconductor element 104. In addition, two positioning holes 118a for positioning are provided on the base of U-shaped heat sink 118. As shown in FIG. 4, two protrusions 108a are provided on one end of sub-board 108. Accordingly, as shown in FIG. 2, sub-board 108 can be positioned and assembled to heat sink 118 by fitting protrusions 108a into positioning holes 118a on heat sink 118.

Semiconductor element 104 is attached to sub-board 108 in such a way that its element terminals 104c come to the side of protrusions 108a on sub-board 108, which is the side of the base of U-shaped heat sink 118.

As shown in FIG. 5, a pair of board supports 118b are formed on both ends of heat sink 118. This pair of board supports 118b are bent inward to sandwich and hold sub-board 108.

Urethane resin potting material 122 in which inorganic filler is mixed to improve heat conductance is injected inside heat sink 118 so as to cover a part of sub-board 108, semiconductor element 104, temperature sensor 116, connection between element terminals 104c and sub-board 108, and operation controller 117, without any space between.

Sub-board 108 and heat sink 118 are mounted on main board 126. Board terminals 130 are attached to the other end of sub-board 108, which is the end opposite to the aforementioned end where protrusions 108a of sub-board 108 are formed. In other words, board terminals 130 are attached to the end at the side of main board 126. These board terminals 130 electrically couple sub-board 108 and main board 126. As shown in FIG. 3, motor 8 coupled to outside is driven by semiconductor element 104 in electronic circuit device 100.

The operation of the electronic circuit device as configured above is described next.

Semiconductor element 104 generates heat during operation. This generated heat is released by heat sink 118, and thus the temperature normally does not rise excessively. However, if semiconductor device 104 is operated in a high-temperature environment, or heat release by heat sink 118 is hindered for any reason, the temperature of semiconductor element 104 may rise and exceed the operating temperature range.

Operation controller 117 acts to stop the operation of semiconductor element 104 when temperature sensor 116 exceeds a predetermined temperature (e.g., the upper limit of the operating temperature range of semiconductor element 104).

Temperature sensor 116 is disposed near semiconductor element 104, and is surrounded by heat sink 118 that conducts heat away from semiconductor element 104. Still more, space between temperature sensor 116, semiconductor element 104, and heat sink 118 is filled with potting material 122 which has high heat conductivity. Accordingly, the temperature of temperature sensor 116 closely tracks that of semiconductor element 104, even in diverse use environments. If the temperature of semiconductor element 104 rises abnormally high, this temperature rise can be accurately detected.

Accordingly, the temperature of semiconductor element 104 can be accurately detected by temperature sensor 116, and semiconductor element 104 can be protected such as by stopping the operation of semiconductor element 104 at an appropriate temperature, even when the temperature of semiconductor element 104 increases abnormally such as when electronic circuit device 100 is operated in a high-temperature environment or heat release by heat sink 118 is hindered for any reason. Destruction of semiconductors element 104 due to temperature rise can thus be prevented.

The use of urethane resin, which is made by mixing inorganic filler with the potting material, as resin material 122 improves the heat conductivity of the potting material. For example, the heat conductivity of the potting material increases from 0.2 W/m·° C. to about 0.8 W/m·° C. by addition of the inorganic filler. The temperature difference between semiconductor element 104 and temperature sensor 116 thus becomes even smaller, allowing yet more accurate detection of the temperature of semiconductor element 104.

Another effect of the preferred embodiment is that due to better thermal diffusion of the heat generated from semiconductor device 104, heat sink 118 can be downsized. Semiconductor element 104 also becomes more reliable at the same time.

Still another effect is that semiconductor element 104 with small insulation gap between terminals can also be used, since the preferred embodiment has a structure that prevents the ingress of dust and debris from outside by covering the electrical connection area of element terminals 104c of semiconductor element 104 and sub-board 108 with resin material 122.

In the preferred embodiment, resin material 122 is described as potting material for pot molding. However, it is apparent that resin materials other than potting material, which undergo other types of processing, can be used as long as resin material 122 is injected inside heat sink 118 in such a way as to cover sub-board 108, temperature sensor 116, and semiconductor element 104.

INDUSTRIAL APPLICABILITY

The electronic circuit device of the present invention can initiate appropriate temperature protection by accurately detecting the temperature of the semiconductor element, and thus demonstrates improved reliability. The present invention is similarly applicable to other electronic circuit devices that employ semiconductor elements as well as inverter control apparatuses.

The invention claimed is:

1. An electronic circuit device comprising:
   a sub-board electrically coupled to a main board via a board terminal disposed at a sub-board edge, and disposed upright on the main board;
   a semiconductor element mounted on the sub-board, the semiconductor element facing the sub-board in parallel;
   a temperature sensor mounted on the sub-board adjacent the semiconductor element for detecting a temperature of the semiconductor element;
   a heat sink formed so as to surround the sub-board and the semiconductor element; and
   a resin material injected inside the heat sink so as to cover the sub-board, the temperature sensor, and a first portion of the semiconductor element,
   wherein a second portion of the semiconductor element remains uncovered by the resin material and is attached to the heat sink to conduct thermal energy away from the semiconductor element, and
   wherein the semiconductor element stops operating when the temperature sensor detects a temperature exceeding a predetermined temperature.

2. The electronic circuit device as defined in claim 1, wherein the temperature sensor is mounted on the sub-board at the same side of the semiconductor element.

3. The electronic circuit device as defined in claim 1, wherein the resin material is a potting material.

4. The electronic circuit device as defined in claim 1, wherein the resin material has high heat conductance.

5. The electronic circuit device as defined in claim 1, wherein the resin material is a mixture of urethane resin and inorganic filler.

* * * * *